US008364103B2

(12) United States Patent
Pinarello et al.

(10) Patent No.: US 8,364,103 B2

(45) Date of Patent: Jan. 29, 2013

(54) ADAPTIVE ADJUSTMENT OF ACTIVE AREA FOR POWER AMPLIFIER

(75) Inventors: Sandro Pinarello, Munich (DE); Andrea Camuffo, Munich (DE); Chi-Tao Goe, Haar (DE); Nick Shute, Munich (DE); Jan-Erik Mueller, Ottobrunn (DE)

(73) Assignee: Intel Mobile Communications GmbH, Neubiberg (DE)

( * ) Notice: Subject to any disclaimer, the term of this patent is extended or adjusted under 35 U.S.C. 154(b) by 112 days.

(21) Appl. No.: 12/886,833

(22) Filed: Sep. 21, 2010

(65) Prior Publication Data

US 2012/0071120 A1 Mar. 22, 2012

(51) Int. Cl.
*H01Q 11/12* (2006.01)
*H04K 3/00* (2006.01)

(52) U.S. Cl. .................................... 455/126; 455/127.1

(58) Field of Classification Search .................. 455/126, 455/127.1–127.3, 127.5; 330/124 R
See application file for complete search history.

(56) References Cited

U.S. PATENT DOCUMENTS

| | | | | |
|---|---|---|---|---|
| 6,819,171 | B2 | 11/2004 | Kenington | |
| 7,203,511 | B2 * | 4/2007 | Trachewsky et al. | 455/522 |
| 7,656,227 | B1 | 2/2010 | Beaudoin et al. | |
| 2004/0235438 | A1 * | 11/2004 | Quilisch et al. | 455/127.2 |
| 2009/0295483 | A1 * | 12/2009 | Alidio et al. | 330/277 |
| 2011/0260797 | A1 * | 10/2011 | Lee | 330/295 |

FOREIGN PATENT DOCUMENTS

| | | | |
|---|---|---|---|
| WO | 0001065 | A1 | 1/2000 |
| WO | 2010019601 | A1 | 2/2010 |
| WO | 2010126907 | A1 | 11/2010 |

OTHER PUBLICATIONS

Carrara, Francesco, et al.; “A 2.4-GHz 24-dBm SOI CMOS Power Amplifier With Fully Integrated Reconfigurable Output Matching Network”, IEEE Transactions on Microwave Theory and Techniques, vol. 57, No. 9, Sep. 2009, p. 2122-2130.

Presti, Calogero D., et al.; “A 25 dBm Digitally Modulated CMOS Power Amplifier for WCDMA/EDGE/OFDM with Adaptive Digital Predistortion and Efficient Power Control”, IEEE Journal of Solid-State Circuits, vol. 44, No. 7, Jul. 2009, p. 1883-1896.

U.S. Appl. No. 13/036,758, filed Feb. 28, 2011.

* cited by examiner

*Primary Examiner* — Lee Nguyen

(74) *Attorney, Agent, or Firm* — Eschweiler & Associates, LLC

(57) ABSTRACT

One embodiment of the present invention relates to a transmission circuit configured to dynamically adjust a number of active transistor cells within a power amplifier based upon a signal quality measurement determined from a feedback. The transmission circuit comprises a transmission chain having a power amplifier configured to provide an output signal. A feedback loop extends from the output of the power amplifier to a control circuit and is configured to provide measured information about output signal (e.g., phase, amplitude, etc.) to the control circuit. The control circuit utilizes the measured signal information to evaluate a measured signal quality of the output signal. The control circuit dynamically adjusts a number of active transistor cells within a power amplifier based upon a signal quality measurement until the power amplifier is optimized to operate at an operating point for low current and good transmission quality.

20 Claims, 9 Drawing Sheets

ADAPTIVE ADJUSTMENT OF ACTIVE AREA FOR POWER AMPLIFIER

FIELD OF INVENTION

The present invention relates generally to transmission of radio frequency waves, and more particularly to a power-efficient transmitter.

BACKGROUND OF THE INVENTION

Modern portable communication devices (e.g., cell phones, PDAs, etc.) comprise a transmission chain configured to transmit radio frequency (RF) signals. The transmission chain typically may comprise a plurality of elements including a power amplifier that converts an input signal with a small amount of energy into a similar output signal with a larger amount of energy. Efficiency and linearity are both factors in the performance of power amplifiers in modern wireless systems.

DETAILED DESCRIPTION OF THE INVENTION

Figure 1:
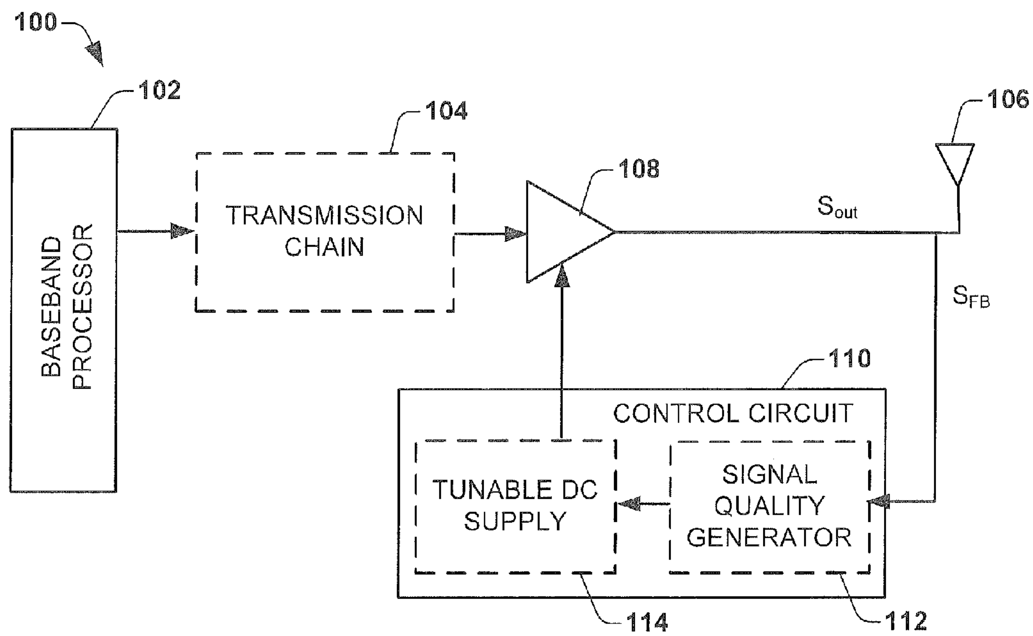
FIG. 1 illustrates a block diagram illustrating a first embodiment of a high efficiency power amplifier having a dynamically adjustable active area.

The present invention will now be described with reference to the attached drawing figures, wherein like reference numerals are used to refer to like elements throughout, and wherein the illustrated structures and devices are not necessarily drawn to scale.

Power consumption is an important design concern for modern mobile communication devices. Low power consumption allows for a number of improvements to a mobile communication device including increased performance, expanded functionality, and longer operation time. In mobile phone transmitters, the current used in a transmission chain comprises a large source of power consumption. Accordingly, a method and apparatus for decreasing the power consumption of a transmission chain is provided herein.

The inventors have appreciated that the power consumption of a transmission chain can be improved by selectively adjusting the operating points of elements within a transmission chain (e.g., by adjusting the operating point of a power amplifier to operate as close as possible to a transmission standard). Based upon this appreciation, a method and structure for dynamically adjusting operating points of elements in a transmission chain for one or more levels of output power, are provided herein.

In one embodiment, the power consumption of a transmission chain can be improved by consistently evaluating the quality of a signal output from the transmission chain and by iteratively adjusting the operating point of one or more elements within the transmission chain (e.g., a power amplifier) so that the evaluated quality of the output signal is optimized to reduce the transmission chain current consumption without infringing the communication standard requirements.

More particularly, a transmission circuit configured to dynamically adjust an operating point of one or more transmission chain elements to operate at operation points optimized for low current and good transmission quality is provided herein. The transmission circuit comprises a transmission chain having a plurality of elements configured to generate a signal $S_{OUT}$ that is output from the transmission chain. A feedback loop is configured to provide measured information about output signal (e.g., phase, amplitude, etc.) to a control circuit. The control circuit utilizes the measured signal information to evaluate the quality of the output signal. The control circuit may iteratively evaluate the quality of the output signal and based thereupon dynamically adjust the operating point of one or more of the plurality of transmission chain elements until optimized operating points of the one or more elements have been determined.

The inventors have further appreciated that power amplifiers typically comprise one of the largest sources of power consumption within a transmission chain. Based upon this appreciation, in one embodiment the operating point of a power amplifier may be optimized by dynamically adjusting the active area of the power amplifier, or in other words by dynamically adjusting the number of active transistor cells in a power amplifier architecture.

FIG. 1 illustrates a first embodiment of a transmission circuit 100 configured to dynamically adjust the operating point of a power amplifier comprised within a transmission chain by adjusting the active area (e.g., number of active transistor cells) of the power amplifier based upon an evaluated quality of an output signal. The transmission circuit 100 comprises a transmission chain 104 comprised between a signal 102 (e.g., baseband processor) and an antenna 106. In one embodiment, a baseband processor 102 is configured to output a baseband signal to transmission chain 104. Based upon the baseband signal, the transmission chain 104 is configured to generate a modulated RF output signal which is provided to a power amplifier 108 configured to provide an increased power output signal $S_{OUT}$ to the antenna 106 for transmission.

The transmission circuit 100 also comprises a feedback loop extending from the output of the transmission chain 104 to a control circuit 110. The feedback loop is configured to provide information about the output signal $S_{OUT}$ (e.g., phase, amplitude, etc.) to the control circuit 110. In one embodiment the control circuit 110 may comprise a signal quality generator 112 and tunable DC supply 114. The control circuit 110 is configured to receive the output signal information and to execute an algorithm that evaluates the quality of the output signal, to generate a measured signal quality, based upon the received signal information.

In one embodiment, shown in FIG. 1, the output signal is coupled back to the control circuit 110, which is configured to measure signal information (e.g., instantaneous amplitude and/or phase of the output signal) directly from the output signal. In an alternative embodiment, a separate measurement circuit may measure information about the output signal (e.g., phase, amplitude, etc.) and provide it to the control circuit 110.

Based upon the measured signal quality of the output signal, the control circuit 110 dynamically adjusts an operating point of the power amplifier within the transmission chain by iteratively adjusting the active area (i.e., the number of active transistor cells) of the power amplifier to minimize the power amplifier's current consumption while maintaining a sufficient signal quality.

In one embodiment, the measured signal quality of the output signal may be compared to a predetermined threshold value $S_{TH}$. If comparison indicates that the quality of the output signal is worse than a transmission standard (e.g., the measured signal quality is above the predetermined threshold value $S_{TH}$) the actual signal quality can be improved by increasing the active area (e.g., the number of active transistor cells) to achieve a better signal quality. If comparison indicates that the quality of the output signal is better than a transmission standard (e.g., the measured signal quality is above the predetermined threshold value $S_{TH}$) the actual signal quality can be decreased by reducing the active area (e.g., the number of active cells) to achieve a lower signal quality.

In one embodiment the predetermined threshold value may comprise one or more values determined from lab measurements to comprise a safety threshold value that allows the transmission circuit 100 to operate in a condition safe enough to guarantee good modulation quality under various circumstances. In another embodiment, the predetermined threshold is set below a system specification so that no violations of communication standards (e.g., a minimum transmission signal power) occur. In an additional embodiment, the threshold may allow for different threshold values according to the output power and/or type of modulation being used.

Therefore, in transmitter circuit 100 the control circuit 110 is configured to drive the active area of a power amplifier in a transmission chain 104 to an optimized value that reduces the current consumption of the transmission chain 104 (e.g., that selects an active area that is just large enough to satisfy a standard for a certain output power).

It will be appreciated that the control circuit 110 may continuously evaluate the signal quality of the output signal. It may for example, check at regular time intervals whether the measured signal quality is below the predetermined threshold value $S_{TH}$. Such continuous evaluation allows the control circuit 110 to maintain the transmitter circuit 100 in an optimized state while ensuring that violations of communication standards do not occur. For example, based upon the measured signal quality the control circuit 110 can adjust the active area of a power amplifier to comprise a first area (i.e., activate a first number of transistor cells) having a first current consumption level, at a first time. At a second later time, based upon the measured signal quality the control circuit 110 can adjust the active area of a power amplifier to comprise a second area (i.e., activate a second number of transistor cells) having a second current consumption level smaller than the first current consumption level, at a second time.

Figure 2:
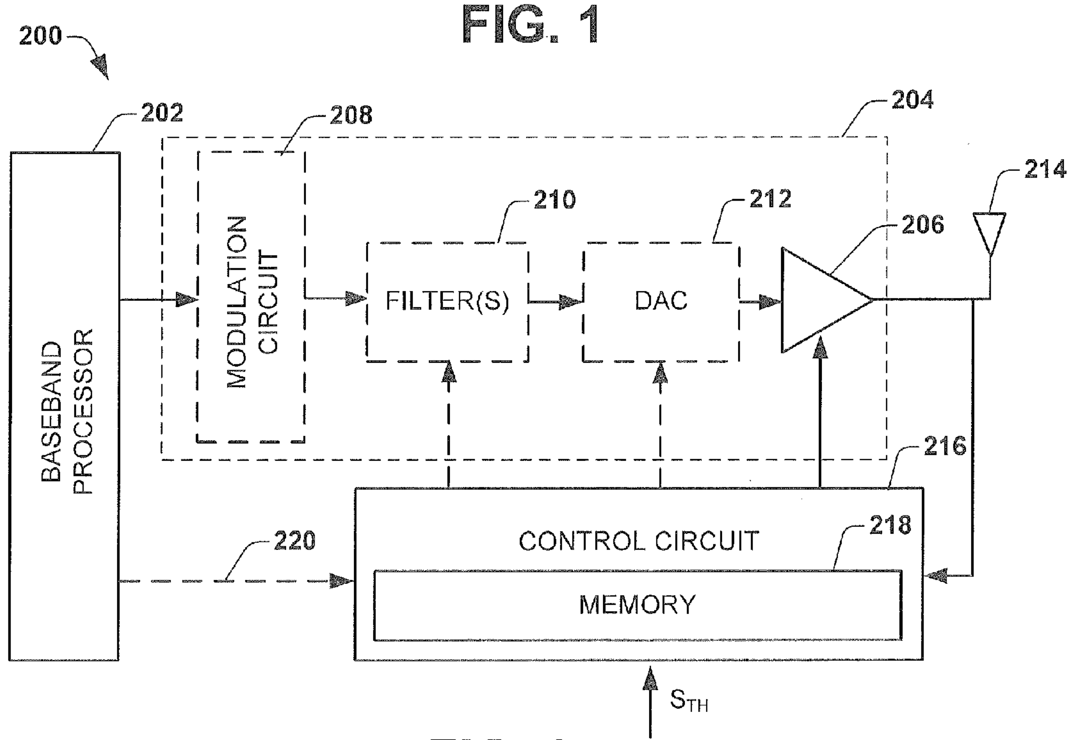
FIG. 2 illustrates a block diagram illustrating an alternative embodiment of a high efficiency power amplifier having a dynamically adjustable active area.

FIG. 2 illustrates a more detailed exemplary embodiment of a transmission circuit 200 configured to dynamically adjust the active area (i.e., number of active cells) of a power amplifier 206 comprised within a transmission chain 204.

As shown in FIG. 2, the transmission chain 204 comprises a modulation circuit 208, one or more filters 210, and a power amplifier 206. In various embodiments, the transmission chain 204 may also comprise a wide range of additional elements depending on considerations such as modulation type. It will be appreciated that the transmission chain 204 is not limited to a particular modulation type, but in various embodiments may comprise different elements that enable the operation of different modulation types.

A control circuit 216 is configured to measure parameters of the signal $S_{OUT}$ output from the power amplifier 206 and to evaluate a measured signal quality based thereupon. In one embodiment, the control circuit 216 executes an algorithm (e.g., see FIG. 3), stored in a memory 218, that utilizes the measured parameters to determine a measured signal quality of an output signal. In one embodiment, the measured signal quality may be compared to a value of a predetermined threshold value $S_{TH}$ (e.g., stored in the memory 218). In another embodiment, a variation of the measured signal quality may be compared to a predetermined variation threshold value (e.g., stored in the memory 218).

As shown in FIG. 2, the control circuit is coupled to power amplifier 206 to dynamically adjust the active area of the power amplifier. The control circuit 216 may also be coupled to other elements (e.g., filter 210, DAC 212, etc.) in the transmission chain 204, to dynamically adjust the operating point of the other elements. The control circuit 216 dynamically adjusts the operating point of one or more elements in the transmission chain 204 based upon the comparison of the measured signal quality of the output signal $S_{OUT}$ and the value of the predetermined threshold value $S_{TH}$.

For example, in one embodiment if the measured signal quality is above the predetermined threshold value the control circuit 216 can reduce the active area of the power amplifier 206. Similarly, the control circuit 216 may adjust the bandwidth of the filter 210 to adjust the filter's output signal characteristics based upon measured characteristics of an output signal and/or it may adjust a voltage signal provided to DAC 212 to adjust the DAC's gain, and therefore adjust the operating point of the DAC.

In one embodiment, the control circuit 216 is configured to incrementally adjust (e.g., increase or decrease) the operating point of one or more of the elements in the transmission chain 204 in a stepwise manner until the output signal $S_{OUT}$ comprises measured characteristics, which when evaluated provide a measured signal quality that is less than or equal to the predetermined threshold.

It will be appreciated that measured signal quality (SQ) may comprise a numeric value indicative of the actual quality of an output signal $S_{OUT}$. In various embodiments, the quality of the output signal may be measured according to a variety of different ways. For example, in one embodiment, the quality of the output signal may be measured directly, by comparing a demodulated RF feedback signal (e.g., the signal at the output of the power amplifier) with a reference signal (e.g., the signal at the input of the power amplifier provided by line 220). In an alternative embodiment, the quality of the output signal may be measured indirectly, by evaluating the AM/AM and AM/PM distortion introduced by the power amplifier. In yet another embodiment, the adjacent channel leakage ratio (ACLR) can be measured and used as an indicator of the signal quality (e.g., a low ACLR indicates a high signal quality and a high ACLR indicates a low signal quality).

It will also be appreciated that although the control circuit 216 is shown in FIG. 2 as a distinct circuit component, that it may be comprised within a processing unit of the transmission circuit 200.

Figure 3:
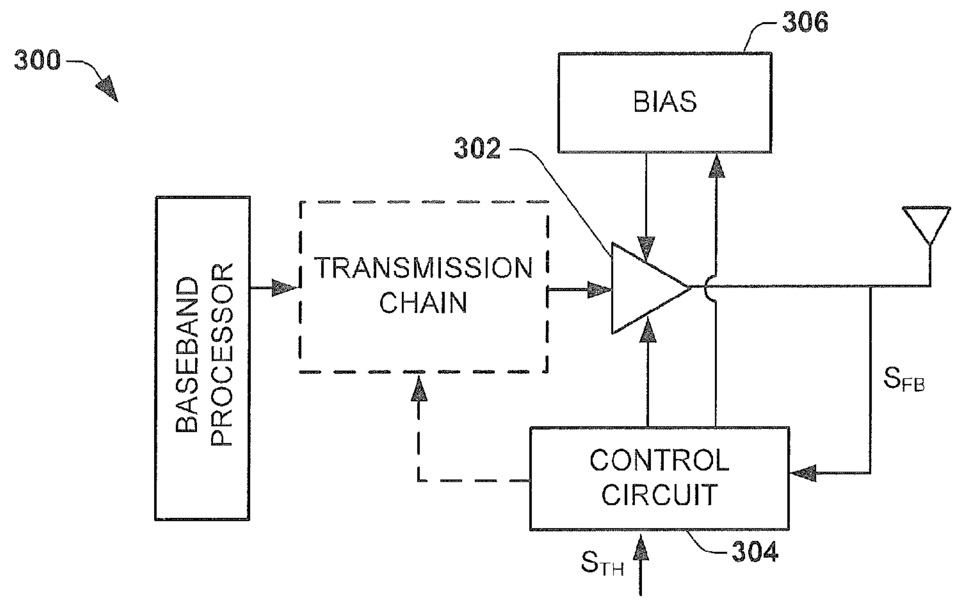
FIG. 3 illustrates a block diagram illustrating an alternative embodiment of a high efficiency power amplifier having a dynamically adjustable active area.

FIG. 3 illustrates an additional embodiment of a transmission circuit 300 configured to dynamically adjust the active area (i.e., number of active cells) of a power amplifier 302. As shown in FIG. 3, a control circuit 304 may be further configured to control a bias circuit 306 configured to provide a bias voltage or a bias current to the power amplifier 302. The controllable bias circuit 306 provides for adaptive bias control in combination with adaptive active area control. In one embodiment, the bias voltage or a bias current may be set in accordance with the active area of the power amplifier 303.

Figure 4:
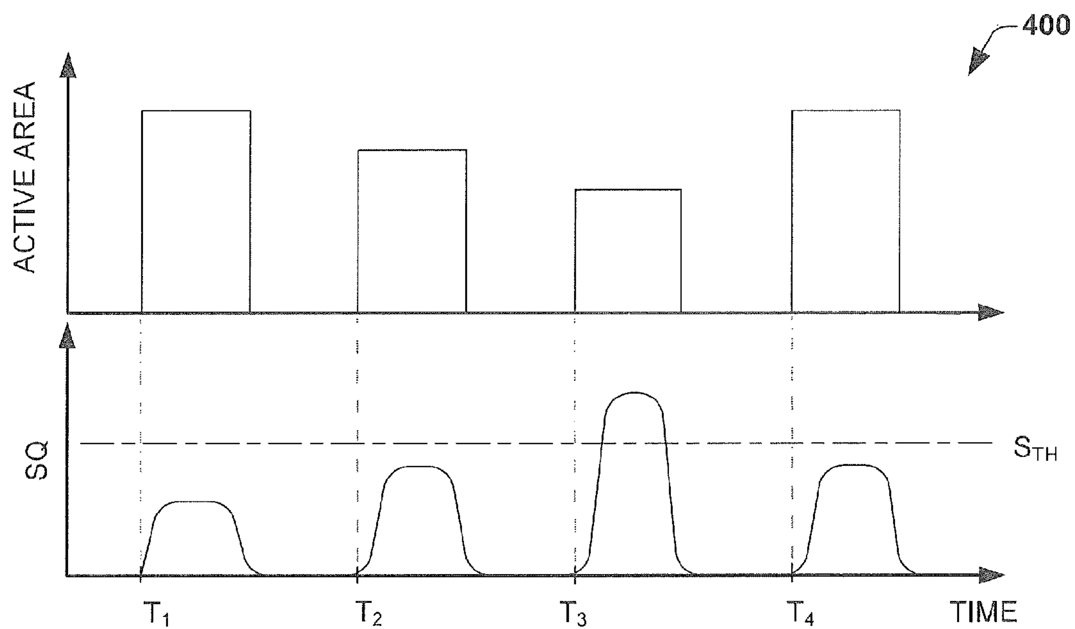
FIG. 4 illustrates a bar graph showing the active area of a power amplifier as a function of time for an algorithm configured to dynamically adjust the active area of a power amplifier.

FIG. 4 illustrates a signal diagram showing dynamic adjustment of a power amplifier's active area according to a search algorithm that may be executed by a control circuit (e.g., control circuit 216) to optimize the operating point of a power amplifier for low current and good transmission quality. The description of FIG. 4 utilizes the terms "actual signal quality" to refer to an actual quality of a signal, "measured signal quality" to refer to a numeric value calculated to correspond to a measured signal's quality, and "predetermined quality threshold" to refer to a numeric threshold that the "measured signal quality" may be compared with (note that a predetermined signal quality may not be compared to an actual signal quality, since an actual signal quality is not a numeric value).

To understand FIG. 4, it will be appreciated that the active area of a power amplifier is directly proportionate to the current consumption of the power amplifier. Therefore, by increasing or decreasing the active area of the power amplifier, the current consumption of the power amplifier can be increased or decreased. Also, the current consumption of a power amplifier is directly proportionate to the actual signal quality. Accordingly, as the current passing through a power amplifier increases, the actual quality of the signal gets better. Therefore, if an actual signal quality is above a minimum standard for transmission, the actual signal quality may be decreased causing the current consumption of a power amplifier to be decreased and the overall power consumption of the power amplifier to be decreased (as shown in FIG. 4, the actual signal quality is inversely proportionate to the measured signal quality; e.g., as the active area decreases and the current passing through a power amplifier decreases, the actual signal quality decreases but the measured signal quality increases). Based upon these relationships, the algorithm attempts to incrementally decrease a power amplifier's current consumption (and therefore the overall power consumption of the transmission chain) while maintaining a measured signal quality that is below a predetermined quality threshold (i.e., that has an actual signal quality that is above an actual signal quality corresponding to a minimum transmission standard that ensures good transmission).

More particularly, the active area of a power amplifier at a first time, $T_1$, has an initial value of $A_1$. The initial value $A_1$ corresponds to a measured signal quality that is below the predetermined quality threshold $S_{TH}$ (i.e., that has an actual signal quality that is better than a minimum transmission standard). Since the measured signal quality is below the predetermined quality threshold $S_{TH}$, the algorithm determines that it may decrease the active area of the power amplifier. The amount by which the active area is decreased is dependent upon the granularity with which the active area may be switched on and off within a power amplifier (i.e., the active cell size). For smaller active cells, the decrease in active area, and therefore current consumption, is smaller than for larger active cells.

At time $T_2$, the active area of the power amplifier is incrementally reduced, causing a drop in the power amplifier's current consumption and an increase in the measured signal quality. Since the measured signal quality remains below the predetermined quality threshold $S_{TH}$ (Le., actual signal quality remains better than an actual signal quality corresponding to a minimum transmission standard), the algorithm determines that it may further decrease the active area of the power amplifier. At time $T_3$, the active area of the power amplifier is incrementally reduced causing a drop in the power amplifier's current consumption and an increase in the measured signal quality. This increase in the measured signal quality causes the measured signal quality to go above the predetermined quality threshold $S_{TH}$. Because the measured signal quality is above the predetermined quality threshold $S_{TH}$ the algorithm determines that the actual signal quality is unacceptably low. Accordingly, at time $T_4$, the active area of the power amplifier is increased to a level that reduces the measured signal quality to a level that is below the predetermined quality threshold $S_{TH}$.

As shown in FIG. 4, the active area is incrementally decreased when the measured signal quality is below the predetermined quality threshold $S_{TH}$. In an alternative embodiment, the active area may be set to a previous condition where the measured signal quality was below the predetermined threshold value (e.g., to the active area at time $T_2$). In another alternative embodiment, the active area may be set abruptly back to the initial condition (e.g., the active area at time $T_1$) for a selected output power when the measured signal quality is above the predetermined quality threshold $S_{TH}$.

As described herein, the value of the measured signal quality increases as the actual signal quality decreases. This inverse relationship between the measured signal quality and the actual signal quality allows for the system to maintain a high transmitted actual signal quality by keeping the measured signal quality below the predetermined threshold value $S_{TH}$. It will be appreciated that alternative measured signal qualities may also be used, such that the value of a measured signal quality decreases as the actual signal quality decreases. Such alternative measured signal qualities would maintain a high actual signal quality by keeping the measured signal quality above a predetermined threshold value.

Figure 5:
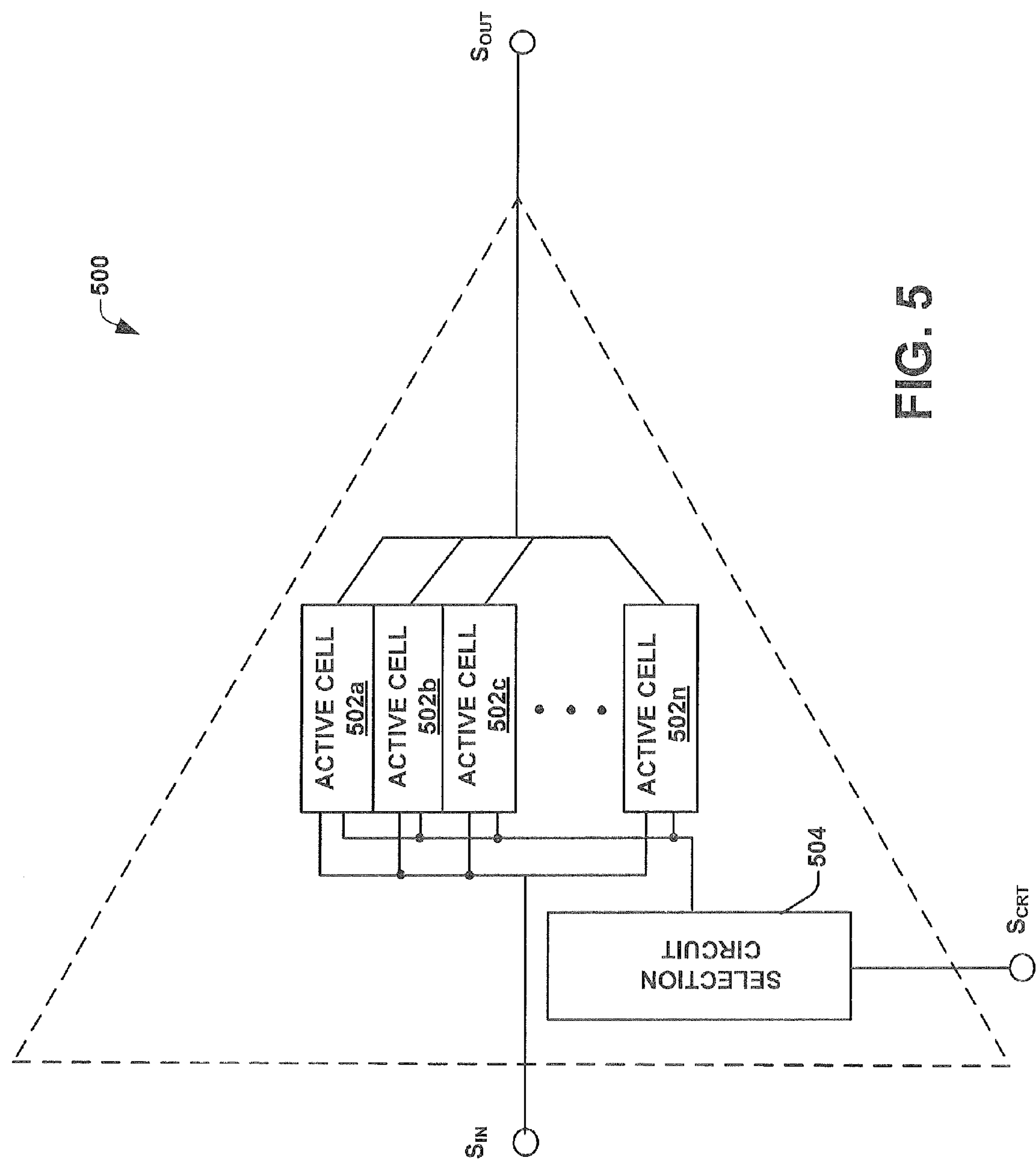
FIG. 5 illustrates a block diagram illustrating a high efficiency power amplifier having a plurality of active cells that may be dynamically activated.

FIG. 5 illustrates a schematic diagram of a power amplifier 500, particularly illustrating the dynamically adjustable active area of the power amplifier 500. The schematic diagram is a simplification of a power amplifier to aid in understanding the present invention and is not intended in a limiting manner or to illustrate all technical components of a power amplifier. One skilled in the art will appreciate that power amplifiers may have a different geometry or layout.

Power amplifiers usually comprise a matrix of transistors (or different blocks of transistors combined together). As shown in FIG. 5, a power amplifier may comprise a plurality of active cells **502*a*-502*n*. Respective active cells 502*x*** may correspond to a single transistor or block of transistors (e.g., rows or columns of a transistor matrix) that may be selectively operated.

The active area of the power amplifier 500 can be adjusted by adjusting the number of active cells 502$x$ in the power amplifier architecture. As shown in FIG. 5, respective active cells 502$x$ can be switched on or off to increase or decrease the active area of the power amplifier.

Switching the active cells 502$x$ on and off may be done through using a variety of different methods. The selective operation of the active cells may be done through use of a control signal (e.g., control-voltage, bit streaming, control word, etc.), for example. In one embodiment, a control signal $S_{CRTL}$ comprising a control word is provided to a selection circuit 504. Based upon the received control word, the selection circuit 504 sends an activation signal to selected active cell transistor gates, causing the active cell transistors to turn on and thereby increase the overall active area of the power amplifier. In alternative embodiments, the selection circuit 504 can provide a signal to a plurality of diodes configured to connect and disconnect the input and output paths when switched on and off.

Figure 6A:
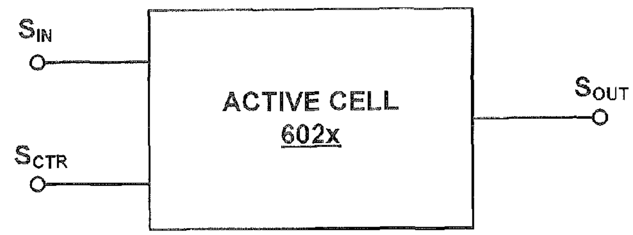
FIGS. 6A-6E illustrate different embodiments of power amplifier transistor block that may be active a transistor block that may be selectively operated.

The active cells can be dynamically switched on or off which increase or decrease the active area. As shown in FIG. 5, the overall active area of the power amplifier will be adjusted based on a selected number of active cells. For example, if active cells 502$a$, 502$b$, 502$c$, and 502$d$ are selected, the power amplifier will have an active area that results in a first current consumption by the power amplifier. However, if active cells 502$a$ and 502$b$ are selected, the power amplifier will have a smaller active area that results in a second current consumption, smaller than the first current consumption, by the power amplifier FIGS. 6A-6E illustrate more detailed embodiments of circuitry that may be used to selectively operate a transistor block (i.e., active cell comprising one or more transistors) comprised within an active cell of a power amplifier. The active cell may comprise a plurality of inputs that are utilized to enable selective operation of a transistor block. In FIG. 6A, the active cell 602 is configured to have an input signal, a control signal input, and a signal output.

Figure 6B:
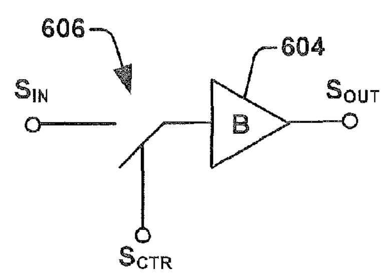

FIG. 6B illustrates an embodiment of an active cell having a switching mechanism 606 disposed upstream of (i.e., prior to) the transistor block 604. The switching mechanism 606 may be controlled by a control signal $S_{CTR}$ and is configured to couple or decouple the transistor block 604 from the power amplifier. For example, if the control signal closes the switching mechanism 606, the transistor block 604 will be coupled to the power amplifier increasing the active area of the power amplifier. In contrast, if the control signal opens the switching mechanism 606 the transistor block 604 will be decoupled to the power amplifier decreasing the active area of the power amplifier.

Figure 6C:
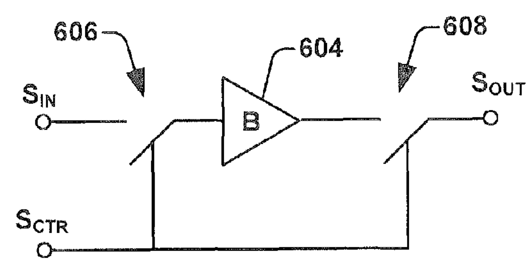

FIG. 6C illustrates an alternative embodiment of an active cell having a first switching mechanism 606 disposed upstream to the transistor block 604 and a second switching mechanism 608 disposed downstream of the transistor block 604. The switching mechanisms 606 and 608 may be controlled by a control signal $S_{CTR}$ to couple or decouple the transistor block 604 from the power amplifier.

Figure 6D:
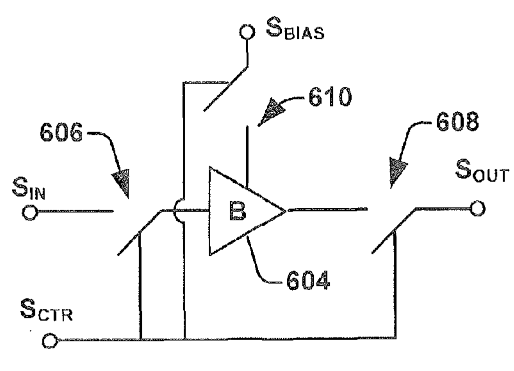

FIG. 6D illustrates an alternative embodiment of an active cell further comprising a switching mechanism 610 configured to selectively supply a bias signal comprising a bias voltage or bias current to the transistor block 604 (e.g., switched on and off) based upon the control signal $S_{CRT}$. In one embodiment this control of the bias may control biasing voltage (i.e. current) at the input and/or output ports of the transistor block 604.

Figure 6E:
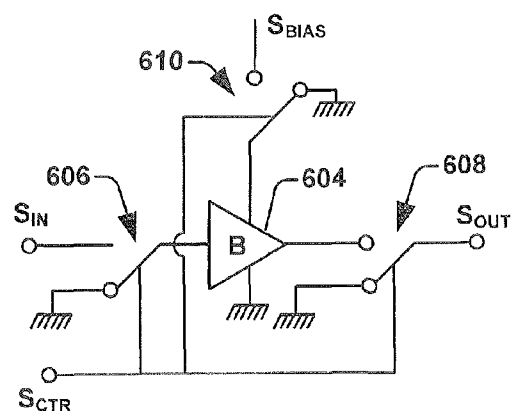

FIG. 6E illustrates an alternative embodiment of an active cell comprising switching mechanisms 606, 608, and 610 that are configured to selectively couple the input node, the output node, and the bias node to ground, based upon a control signal $S_{CRT}$.

It will be appreciated that FIGS. 6A-6E are non-limiting examples of circuitry that may be used to selectively operate a transistor block (i.e., active cell comprising one or more transistors) comprised within a power amplifier.

Figure 7:
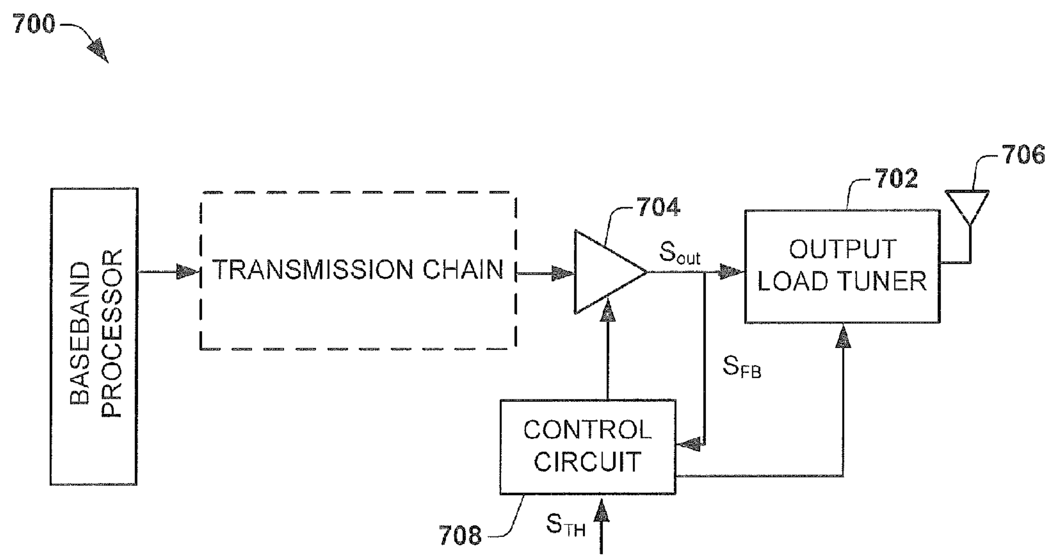
FIG. 7 illustrates a block diagram illustrating an alternative embodiment of a high efficiency power amplifier having a dynamically adjustable active area further comprising an output load tuner.

If the active area of a power amplifier dramatically changes, the output and input matching may change depending on the sensitivity of the transistors to variations of load. FIG. 7 illustrates an embodiment of a transmitter circuit including an output load tuner 702, configured to match the load between the output of the power amplifier 704, which depends on the active area of the power amplifier, and the antenna 706. For example, a change in the active area of a power amplifier causes a change in the optimum load at the output stage of the power amplifier. The output load tuner 702 maintains the matching of an antenna load (e.g., 50 Ohm) to the optimum output impedance of the power amplifier. For example, if an active area of the power amplifier is doubled (e.g., the number of active transistor blocks is doubled) the output load tuner 702 may double the load of the antenna. In one embodiment, the control circuit 7078 is configured to control the output load tuner 702. Such an embodiment allows for the control circuit 708 to control both the active area of the power amplifier and the output load tuner 708

As shown in FIG. 7, the output load tuner 702 may be configured downstream of the feedback signal so that it does not effect the quality of the output signal that is measured by the control circuit 708. It will be appreciated that although the control circuit 708 is illustrated as a separate block in FIG. 7, that in one alternative embodiment, the control of the matching could be built within the power amplifier so that one information-signal is used.

Figure 8:
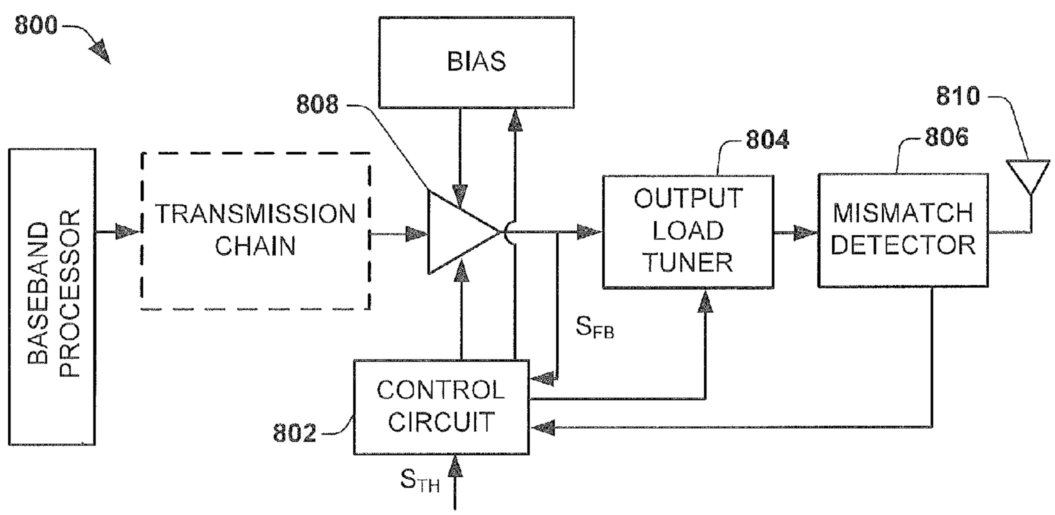
FIG. 8 illustrates a block diagram illustrating an alternative embodiment of a high efficiency power amplifier having a mismatch detector coupled to the output load tuner.

FIG. 8 illustrates an alternative embodiment of a transmission circuit 800 having an output load tuner, wherein a mismatch detector circuit 808 may be configured downstream of the output load tuner 804. The mismatch detector circuit 806 is configured to detect a mismatch of the load between the output of the power amplifier 808 and the antenna 810. If a load mismatch is detected the mismatch detector 806 will provide a signal back to the control circuit 802 indicating that a mismatch is present. The control circuit 802 will send a control signal to the output load tuner 804, wherein the control signal varies the load matching of the output load tuner.

In one embodiment, the mismatch detector 806 may be configured to measure a value of the load mismatch between the power amplifier 808 and the antenna 810, and to provide the correct load, for an active area of the power amplifier, to the control circuit 802. The mismatch detector 806 therefore may provide an optimized load value for an active area of the power amplifier, based upon measured load data.

Figure 9:
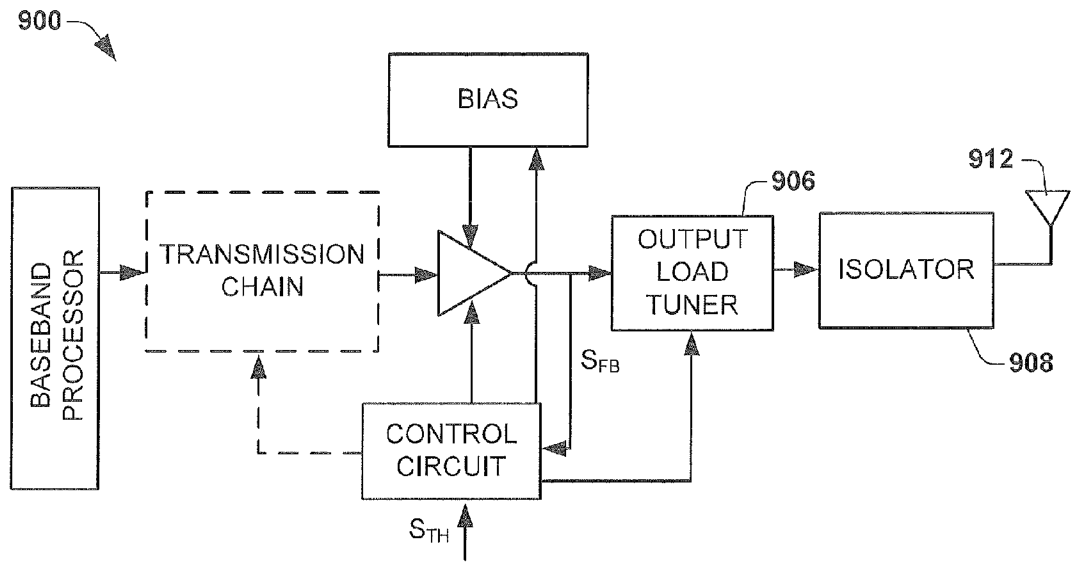
FIG. 9 illustrates a block diagram illustrating an alternative embodiment of a high efficiency power amplifier having a dynamically adjustable active area further comprising an isolator coupled to the output load tuner.

FIG. 9 illustrates an alternative embodiment of a transmission circuit as provided herein, wherein an isolator 908 is disposed between the output load tuner 906 and the antenna 912. The isolator 908 is configured to isolate the output load tuner 906 from the antenna 912. When a load mismatch is present, and a backscattered wave is reflected from antenna 912, the isolator will absorb the backscattered wave, protecting the output load tuner.

Figure 10:
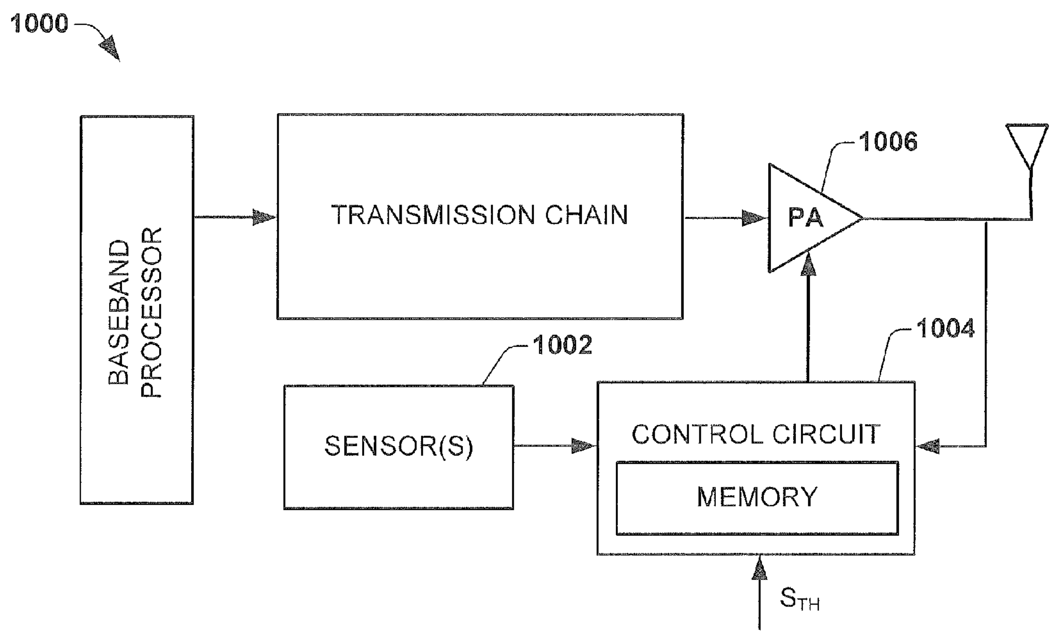
FIG. 10 illustrates a block diagram illustrating an alternative embodiment of a high efficiency power amplifier having a dynamically adjustable active area further comprising sensors configured to measure external parameters.

FIG. 10 illustrates an alternative embodiment of a transmission circuit as provided herein, wherein the transmission circuit comprises additional sensors 1002 configured to measure external variables. As shown in FIG. 10 the additional sensors 1002 may be coupled to the control circuit 1004 and may provide additional information (e.g., temperature, voltage, current, etc.) that may be used by the control circuit 1004 to determine a measured signal quality.

In one embodiment, the additional sensors 1002 may comprise sensors configured to sense environmental conditions such as temperature (e.g., a thermistor), for example. Knowing the environmental conditions makes it possible to adjust the adaptive parameter in a simpler and more effective way.

Furthermore, since the control circuit 1004 is configured to continuously evaluate the measured signal quality, additional sensors 1002 configured to sense environmental conditions may add additional information to the evaluation that allows the control circuit 1004 to incorporate changes due to environmental changes. This additional information allows the control circuit 1004 to maintain the system in an optimized state in light of changes that may occur due to environmental changes. Since changes in external variables may occur in a time frame which is longer than a slot time, the control circuit can follow changes adaptively, thereby allowing for saving of current and power.

In an additional embodiment, the additional sensors 1002 may measure voltage and/or current passing through the transmission chain 1006. The use of voltage and/or current sensors allows for the adjustment of voltage and/or current bias of one or more transmission chain elements. Adjusting the voltage and/or current bias allows for the adaptive active area technique to be combined with adaptive bias techniques to provide for an improved overall optimization of the operating point of a power amplifier. In various embodiments, it is possible to optimize the active area adjustment technique, the DC/DC bias voltage adjustment technique, and/or the bias current adjustment technique alternatively in time.

Figure 11:
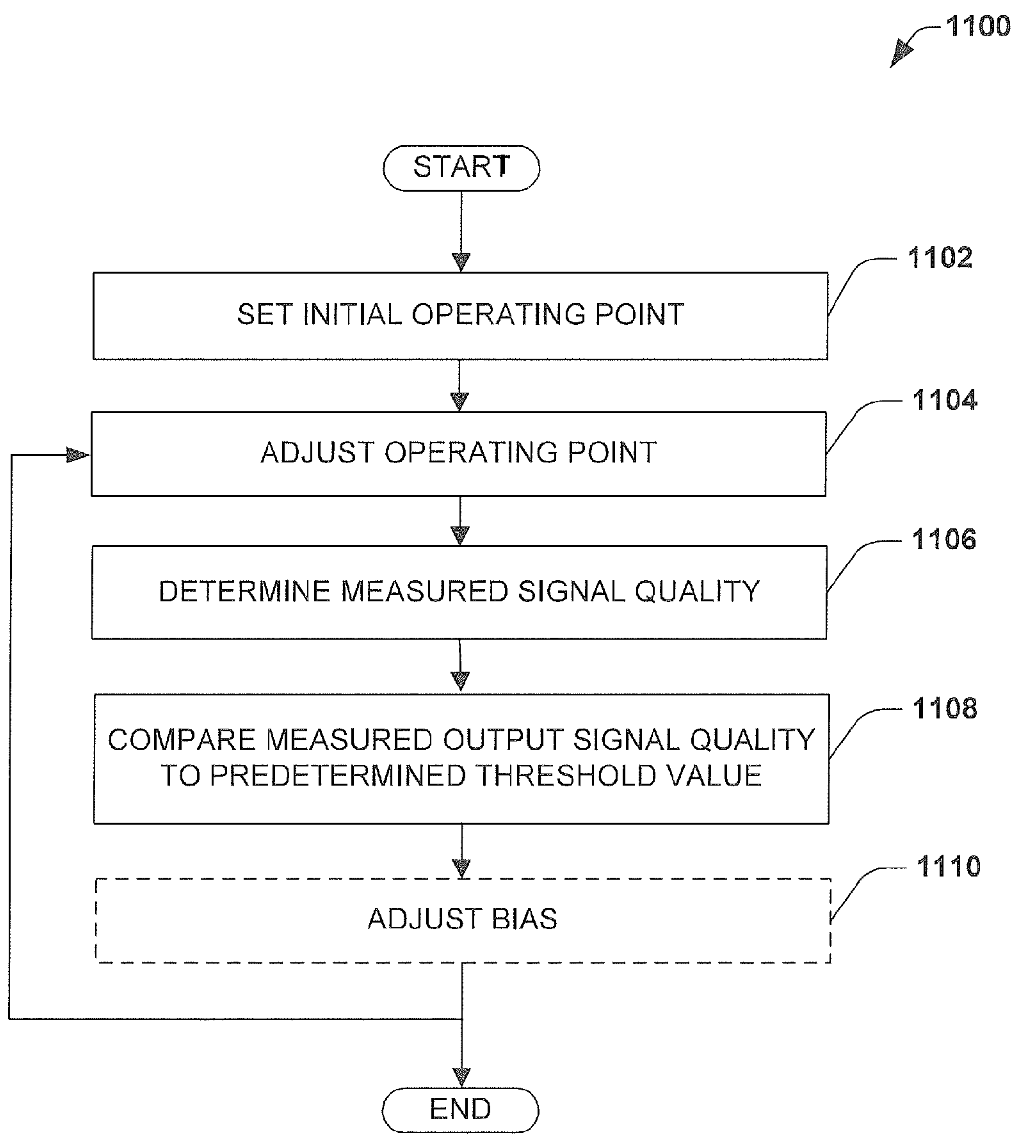
FIG. 11 illustrates a flow diagram showing a method for optimizing the operating point of a transmission chain element.
Figure 12:
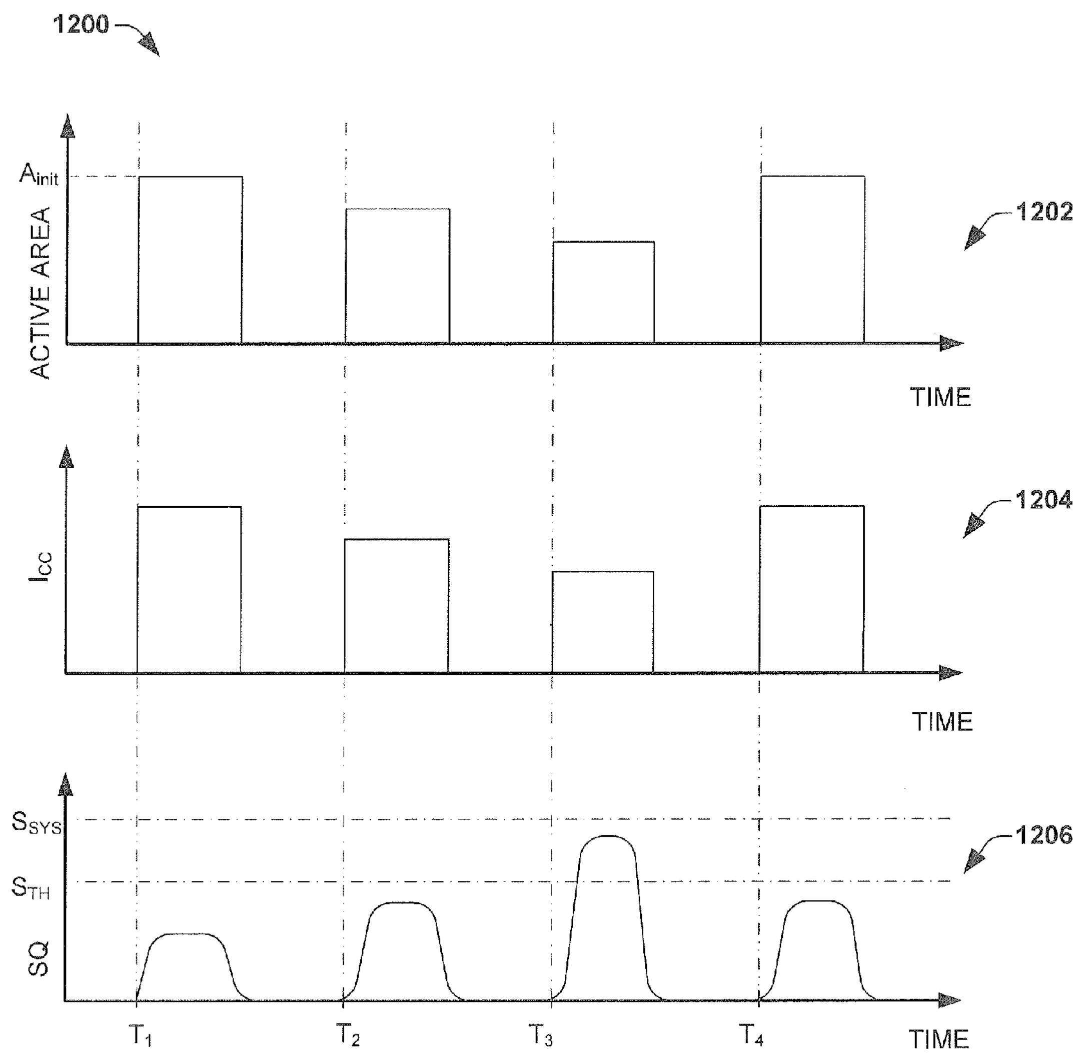
FIG. 12 illustrates a graph illustrating a measured signal quality as a function of time.

In one embodiment, the predetermined quality threshold value $S_{TH}$ may comprise a plurality of possible thresholds that correspond to a power amplifier under different conditions (e.g., temperature, antenna size, etc.). Such predetermined quality threshold values may be determined from lab measurements to comprise a safety threshold value that allows the transmission circuit to operate in a condition safe enough to guarantee good modulation quality under various circumstances FIG. 11 illustrates a flow diagram of an exemplary method 1100 that may be used (e.g., operated by a control circuit) to dynamically adjust an operating point of a transmission chain element in a stepwise manner. The method drives the operating point of a transmission chain element to a value that is close to a predetermined quality threshold so that a transmission chain is optimized for both low current and good transmission quality. FIG. 12 illustrates signal diagrams of an exemplary power amplifier to aid in understanding the steps of method 1100.

While method 1100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuits shown in FIGS. 1, 2, etc., are non-limiting examples of circuits that may be used to implement method 1100). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

At 1102 an initial operating point of a transmission chain element is set. The initial operating point of a transmission chain element may correspond to an active area, or a number of active cells, of a power amplifier. In one embodiment, the initial operating point (e.g., active area) may be set large enough to guarantee good linearity for an output power of the transmission chain. For example, the safety threshold may be set at a level which results in an output signal having a voltage standing wave ratio of up to 4:1, taking into consideration temperature variations, process variations, etc.

As shown in FIG. 12, the active area (graph 1202) of a power amplifier is initially set to a value of $A_{init}$ at time $T_1$. The active area value of $A_{init}$ corresponds to a measured signal quality (SQ) at time $T_1$ (graph 1206) that is well below the predetermined quality threshold $S_{TH}$ of a power amplifier.

The operating point is adjusted at 1104. Adjustment of the operating point may comprise decreasing the active area or increasing the active area of a power amplifier, for example. The active area may initially be reduced to cause a small drop in the collector current passing through the power amplifier (i.e., and an overall power consumption of the transmission chain). The reduced current causes an incremental increase in the measured signal quality (i.e., and an incremental decrease in the actual signal quality).

In one embodiment, wherein method 1100 is iteratively performed the operating point may be increased or decreased depending on a comparison between a measured signal quality and a predetermined quality threshold value (step 1108). In one embodiment, wherein the measured signal quality is inversely proportionate to an actual signal quality, the operating point is decreased when a measured signal quality (SQ) is below the predetermined quality threshold and the operating point is increased when the measured signal quality (SQ) is above the predetermined quality threshold. In alternative embodiments, wherein the measured signal quality is directly proportionate to an actual signal quality, the operating point may be increased when a measured signal quality (SQ) falls below the predetermined quality threshold and the operating point may be decreased when the measured signal quality (SQ) goes above the predetermined quality threshold.

As shown in FIG. 12, the active area (graph 1202) is decreased from time $T_1$ to time $T_2$. Decreasing the active area results in a decrease in the current consumption of the power amplifier (graph 1204), at time $T_2$, and a corresponding increase in the measured signal quality (graph 1206).

At 1106 a measured signal quality of the output signal is determined. Determining the measured signal quality of the output signal may be done by measuring parameters of the output signal such as amplitude and/or phase. The parameters may then be evaluated to generate a numeric measured signal quality. One skilled in the art will appreciate that the measured signal quality of the output signal may be measured according to a wide variety of methods. The method 1100 provided herein is intended to encompass any method of measuring the actual quality of the output signal. In one exemplary embodiment, the measured signal quality of the output signal may be determined directly, by comparing a demodulated RF feedback signal with a reference signal. In an alternative exemplary embodiment, the measured signal of the output signal may be determined indirectly, by evaluating the AM/AM and AM/PM distortion introduced by the power amplifier. In yet another exemplary embodiment, the adjacent channel leakage ratio (ACLR) can be measured and used as an indicator of the signal quality (e.g., a low ACLR indicates a high signal quality and a high ACLR indicates a low signal quality).

The measured signal quality of the output signal is compared to a predetermined quality threshold value at 1108. In one embodiment, the predetermined quality threshold is set below the system specification so that no violations of communication standard requirements occur. As shown in FIG. 12, the distance between the predetermined quality threshold value $S_{TH}$ and the system specification value $S_{SYS}$ is kept at a value that is sufficiently large to ensure that no violations of the system standards occur. In an additional embodiment, the predetermined quality threshold value may allow for different threshold values according to the output power and/or type of modulation being used. In one embodiment, the predetermined quality threshold value may be set to a value that is below the system specifications, so as to ensure an acceptable transmission quality during a transmission.

Method 1100 may be performed continuously, and therefore if the measured signal quality is below the predetermined quality threshold the operating point of a transmission chain element (e.g., the active area of the power amplifier) is further decreased (step 1102) to further decrease the current (e.g., power consumption) passing through the transmission chain.

The continuous performance of method 1100 causes the operating point of transmission chain elements to be reduced in a stepwise manner when the measured signal quality of the signal is under the optimizing predetermined quality threshold. This stepwise reduction drives the operating point of one or more elements in a transmission chain to optimize the current consumption of the transmission chain. For example, as shown in FIG. 12, when the measured signal quality (SQ) at times $T_2$ and $T_3$ is below the predetermined quality threshold value (step 1108) the active area is reduced (step 1104). Therefore, from time $T_1$ to $T_3$, the active area is incrementally reduced to cause a small drop in the collector current passing through the power amplifier (i.e., and an overall power consumption of the transmission chain).

Furthermore, when the measured signal quality (SQ) at time $T_3$ to $T_4$ is above the predetermined quality threshold value (step 1108) the active area of the power amplifier is increased (step 1104), thereby increasing the current, but assuring the satisfaction of transmission quality requirements. In various embodiments, when the measured signal quality is above a predetermined quality threshold value, the operating point of a transmission element can be increased (e.g., to an area that provides for an acceptable linearity). For example, the operating point may be incrementally increased in one embodiment. In another embodiment, the operating point may be set to a previous condition where the signal quality was below the predetermined quality threshold value. In one embodiment, the operating point may be set abruptly back to the initial condition for the selected output power.

The voltage and/or current bias of one or more transmission chain elements may optionally be adjusted at 1110. Adjusting the voltage and/or current bias of a power amplifier allows for the adaptive active area technique to be combined with an adaptive voltage or current bias techniques to provide for an improved overall optimization of the operating point of a power amplifier. In various embodiments, it is possible to optimize the operating point of a power amplifier using an active area adjustment technique, a DC/DC bias voltage adjustment technique, and/or a bias current adjustment technique in conjunction or alternatively in time.

In one embodiment, the dynamic adjustment of a power amplifier's operating point by adjusting the power amplifier's active area may be performed sequentially with the adjustment of the operating point through different techniques (e.g., bias voltage adjustment, collector current adjustment, etc.). In such an embodiment, respective iterations of method 1100 (e.g., steps 1102 through 1108) may be performed to adjust the operating point of a power amplifier according to a different adjustment technique.

Figure 13:
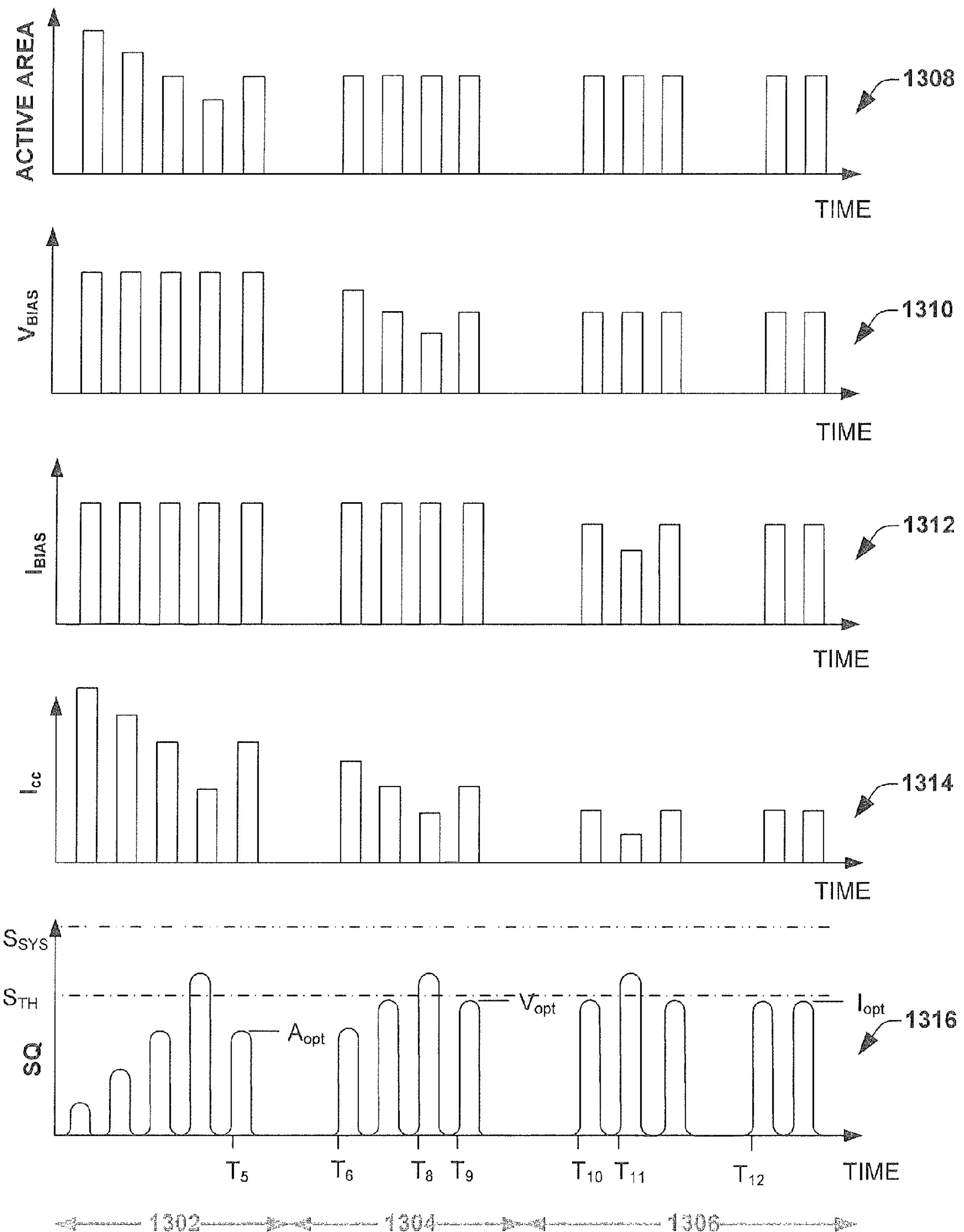
FIG. 13 illustrates a graph illustrating a measured signal quality as a function of time and corresponding currents and voltages, over an extended period of time.

FIG. 13 illustrates signal diagrams of an exemplary power amplifier wherein the active area, the bias voltage, and the bias current are adjusted to optimize the operating point of a power amplifier. As shown in FIG. 13, in a first region 1302, the active area of a power amplifier is adjusted (e.g., as described in FIG. 12) to optimize the operating point of the power amplifier. The active area reaches an optimized measured signal quality value $A_{opt}$ at a time $T_5$. In a second region 1304, beginning at time $T_6$ the bias voltage is adjusted according to an adaptive voltage bias technique (graph 1312). The bias voltage is decreased from time $T_6$ to time $T_8$, causing the measured signal quality (SQ) to get closer and closer to the predetermined quality threshold $S_{TH}$. The voltage bias reaches an optimized measured signal quality value $V_{opt}$ at a time $T_9$. In a third region 1306, beginning at time $T_{10}$ the current bias is adjusted according to an adaptive current bias technique (graph 1314). The bias current is decreased from time $T_{10}$ to time $T_{11}$, causing the measured signal quality (SQ) to get closer and closer to the predetermined quality threshold $S_{TH}$. The current bias reaches n optimized measured signal quality value $I_{opt}$ at a time $T_{12}$.

Therefore the active area, the bias voltage, and the bias current adjustment techniques result in a measured signal quality that is driven to an optimized operating point slightly below a predetermined quality threshold value (graphs 1318). In one embodiment the adaptive active area technique (graph 1308), the adaptive voltage technique (graph 1310), and the adaptive current technique (graph 1312), may be implemented sequentially to provide for increasingly fine adjustment to the active area of the power amplifier. For example, changes to the active area may cause larger changes to the measured signal quality than changes to the bias voltage, while changes to the bias voltage may cause larger changes to the measured signal quality than changes to the bias current. The use of different adaptive techniques, providing different adjustment granularity allows a system to quickly reach an optimized measured signal quality.

It will be appreciated that the term amplifier, as referred to in this disclosure and shown in the associated figures is meant to encompass one or more amplifiers. For example, an amplifier may refer to more than one transistor amplifier consisting of several stages with matching networks. The inventors have contemplated the use of the disclosed invention with the use of a wide variety of amplifiers. Furthermore, although the examples provided herein are described in regards transmitter circuits, it will be appreciated that the invention may be broadly applied to different transceiver and/or transmitter architectures.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A transmitter circuit, comprising:

a power amplifier, having a plurality of transistor cells that can be selectively activated or de-activated, configured to provide an output signal from a power amplifier output to an antenna; and a control circuit configured to receive information about the output signal from a feedback loop extending from the power amplifier output to the control circuit, wherein the control circuit utilizes the received information to determine a measured signal quality of the output signal, and wherein the control circuit is configured to iteratively activate or deactivate a number of the plurality of transistor cells to cause the measured signal quality to converge upon a predetermined quality threshold value, thereby optimizing a current consumption of the power amplifier.

2. The transmitter circuit of claim 1, wherein the control circuit is configured to activate or deactivate the number of the plurality of transistor cells by operating one or more switching mechanisms to couple or decouple one or more transistor cells from the power amplifier.

3. The transmitter circuit of claim 1, wherein the number of activated transistor cells is reduced if the measured signal quality of the output signal is above the predetermined quality threshold value; and wherein the number of activated transistor cells is increased if the measured signal quality of the output signal is below the predetermined quality threshold value.

4. The transmitter of claim 1, wherein the power amplifier comprises a selection circuit configured to receive a control word from the control circuit, wherein the control word selects which of the plurality of transistor cells that can be activated or de- activated.

5. The transmitter circuit of claim 1, further comprising one or more additional sensor coupled to the control circuit, wherein the additional sensors are configured to measure external variables that may be used to assist determining the measured signal quality.

6. The transmitter circuit of claim 1, wherein the control circuit is further configured to dynamically adjust a bias voltage or a bias current of the power amplifier.

7. The transmitter circuit of claim 6, wherein the control signal is configured to sequentially adjust the number of the plurality of transistor cells that are activated or deactivated, the bias voltage, and the bias current.

8. The transmitter circuit of claim 1, wherein the control circuit is further configured to dynamically adjust an operating point of an active filter or a digital-to-analog converter within a transmission chain comprising the power amplifier.

9. The transmitter circuit of claim 1, further comprising an output load tuner, configured to match the load between the output of the power amplifier, which depends on the number of activated transistor cells in the power amplifier, and the antenna.

10. The transmitter circuit of claim 1, wherein the information about the output signal comprises the instantaneous amplitude of the output signal.

11. A transmitter circuit, comprising:

a power amplifier, having a plurality of transistor cells that can be selectively activated or de-activated, configured to provide an output signal from a power amplifier output to an antenna; and a control circuit configured to receive information about the output signal from a feedback loop extending from the power amplifier output to the control circuit and determine a measured signal quality from the received information, wherein based upon the measured signal quality the control circuit activates a first number of the plurality of transistor cells having a first current consumption level, at a first time, by operating first switching mechanisms to respectively couple or decouple a first number of transistor cells from the power amplifier; and wherein the control circuit activates a second number of the plurality of transistor cells having a second current consumption level smaller than the first current consumption level, at a second time, by operating second switching mechanisms to respectively couple or decouple a second number of transistor cells from the power amplifier.

12. The transmitter circuit of claim 11, wherein the number of activated transistor cells is reduced if the measured signal quality of the output signal is above the predetermined quality threshold value; and wherein the number of activated transistor cells is increased if the measured signal quality of the output signal is below the predetermined quality threshold value.

13. The transmitter circuit of claim 11, wherein the control circuit is further configured to dynamically adjust a bias voltage or a bias current of the power amplifier.

14. The transmitter circuit of claim 11, further comprising an output load tuner, configured to match the load between the output of the power amplifier, which depends on the number of activated transistor cells in the power amplifier, and the antenna.

15. A method of power efficient transmission, comprising:

generating a measured signal quality based on a feedback signal from an output of a power amplifier having a plurality of transistor cells that can be selectively activated or de-activated; and iteratively activating or deactivating a number of the plurality of transistor cells based upon the measured signal quality to cause the measured signal quality to converge upon a predetermined quality threshold value, thereby optimizing a current consumption of the power amplifier.

16. The method of claim 15, further comprising providing an initial number of activated transistor cells that causes the power amplifier to operate with good linearity for a corresponding output power.

17. The method of claim 16, further comprising resetting the number of active transistor cells to the initial number if the measured signal quality of the output signal is below a predetermined quality threshold value.

18. The method of claim 15, further comprising iteratively reducing the number of active transistor cells when the measured signal quality of the output signal is above a predetermined threshold value; and increasing the number of active transistor cells when the measured signal quality of the output signal is below a predetermined quality threshold value.

19. The method of claim 15, further comprising dynamically adjusting a bias voltage or a bias current of the power amplifier based upon the measured signal quality.

20. The method of claim 19, wherein the number of the plurality of transistor cells that are activated or deactived, the bias voltage, and the bias current are sequentially adjusted to optimize the current consumption of the power amplifier.

* * * * *